United States Patent
Pu et al.

(10) Patent No.: US 8,759,964 B2
(45) Date of Patent: Jun. 24, 2014

(54) WAFER LEVEL PACKAGE STRUCTURE AND FABRICATION METHODS

(75) Inventors: Han-Ping Pu, Taichung (TW); Mirng-Ji Lii, Sinpu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1676 days.

(21) Appl. No.: 11/779,192

(22) Filed: Jul. 17, 2007

(65) Prior Publication Data

US 2009/0020864 A1    Jan. 22, 2009

(51) Int. Cl.
*H01L 21/00* (2006.01)

(52) U.S. Cl.
USPC ................ 257/690; 257/E23.021; 438/106

(58) Field of Classification Search
USPC ................ 438/106; 257/690, E23.021
See application file for complete search history.

(56) References Cited

U.S. PATENT DOCUMENTS

| | | | |
|---|---|---|---|
| 6,107,164 A | 8/2000 | Ohuchi | |
| 7,170,152 B2 | 1/2007 | Huang et al. | |
| 7,192,807 B1 | 3/2007 | Huemoeller et al. | |
| 7,196,408 B2 | 3/2007 | Yang et al. | |
| 2004/0245608 A1* | 12/2004 | Huang et al. | 257/676 |
| 2005/0017374 A1* | 1/2005 | Kiendl et al. | 257/778 |
| 2005/0282313 A1* | 12/2005 | Akram et al. | 438/108 |
| 2006/0094223 A1* | 5/2006 | Tsai | 438/612 |

OTHER PUBLICATIONS

Keser, B., "Redistributed Chip Packaging," Apr. 1, 2007, Semiconductor International, Reed Business Information, http://www.semiconductor.net/article/CA6428421.html, 5 pp.

* cited by examiner

*Primary Examiner* — Thao X Le
*Assistant Examiner* — Matthew Gordon
(74) *Attorney, Agent, or Firm* — Slater and Matsil, L.L.P.

(57) ABSTRACT

A method of forming a package structure with reduced damage to semiconductor dies is provided. The method includes providing a die comprising bond pads on a top surface of the die; forming bumps on the bond pads of the die, wherein the bumps have top surfaces higher than the top surface of the die; mounting the die on a chip carrier, wherein the bumps are attached to the chip carrier; molding the die onto the chip carrier with a molding compound; de-mounting the chip carrier from the die; and forming redistribution traces over, and electrically connected to, the bumps of the die.

18 Claims, 11 Drawing Sheets

WAFER LEVEL PACKAGE STRUCTURE AND FABRICATION METHODS

TECHNICAL FIELD

This invention relates generally to integrated circuits, and more particularly to the packaging of integrated circuits.

BACKGROUND

With the evolving of semiconductor technologies, semiconductor dies are becoming increasingly smaller. However, more functions need to be integrated into the semiconductor dies. Accordingly, the semiconductor dies need to have increasingly greater numbers of I/O pads packed into smaller areas, and the density of the I/O pads rises quickly. As a result, the packaging of the semiconductor dies becomes more difficult, adversely affecting the yield.

Package technologies can be divided into two categories. One category is typically referred to as wafer level package (WLP), wherein dies on a wafer are packaged before they are sawed. The WLP technology has some advantages, such as greater throughput and lower cost. Further, less under-fill or molding compound is needed. However, WLP suffers drawbacks. As aforementioned, the sizes of the dies are becoming increasingly smaller, and the conventional WLP can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out chip packages, which means the I/O pads on a die can be redistributed to a greater area than the die, and hence the number of I/O pads packed on the surfaces of the dies can be increased.

Figure 1:
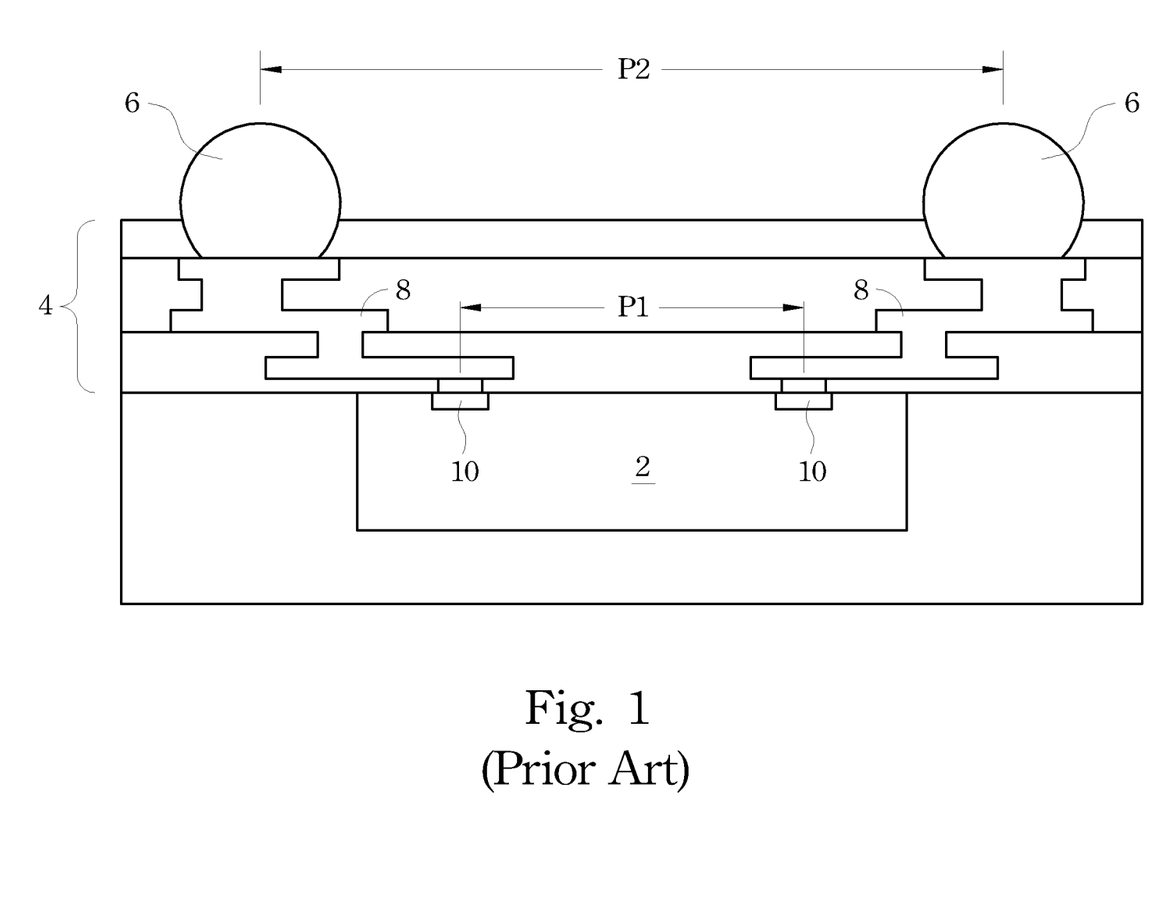
FIG. 1 illustrates a conventional fan-out type package.

FIG. 1 illustrates a conventional fan-out chip package structure. Package substrate 4 includes solder balls 6 and redistribution traces 8. Redistribution traces 8 are electrically connected to pads 10 of die 2, and thus redistribute pitch P1 of pads 10 to a greater pitch P2 of solder balls 6. The resulting package has a significantly greater size and a greater pitch than die 2.

U.S. Pat. No. 7,170,152, U.S. Pat. No. 7,192,807 and U.S. Pat. No. 7,196,408 disclose other fan-out type packaging techniques. These packaging techniques suffer from a common drawback: the dies have to be aligned to their respective connecting portions with very high accuracy. Otherwise, the package may fail.

Accordingly, what is needed in the art is a packaging method having the fan-out ability, while at the same time overcoming the deficiencies of the prior art.

SUMMARY OF THE INVENTION

In accordance with one aspect of the present invention, a method of forming a semiconductor package structure includes providing a die comprising bond pads on a top surface of the die; forming bumps on the bond pads of the die, wherein the bumps have top surfaces higher than the top surface of the die; mounting the die on a chip carrier, wherein the bumps are attached to the chip carrier; molding the die onto the chip carrier with a molding compound; de-mounting the chip carrier from the die; and forming redistribution traces over, and electrically connected to, the bumps of the die.

In accordance with another aspect of the present invention, a method of forming a package structure comprises providing a plurality of dies, each comprising copper bumps having top surfaces higher than top surfaces of the respective dies; providing a chip carrier comprising a plurality of regions, each of the plurality of regions including a plurality of pads laid out as a mirror of the copper bumps on one of the plurality of dies; placing the plurality of dies on the chip carrier, each in one of the plurality of the regions of the chip carrier, wherein the copper bumps are aligned to the pads with solder balls therebetween; reflowing the solder balls so that the plurality of dies are attached to the chip carrier; molding the plurality of dies onto the chip carrier using a molding compound to form a plurality of packages, each comprising one of the dies, wherein the molding compound fills gaps between the copper bumps and gaps between the plurality of dies; de-mounting the chip carrier from the plurality of dies and the molding compound; forming redistribution traces over, and electrically connected to, the copper bumps; and sawing the plurality of packages.

In accordance with yet another aspect of the present invention, a package structure includes a semiconductor die; bonding pads on a top surface of the semiconductor die; bumps on the bond pads, wherein the bumps have top surfaces higher than the top surface of the die; a molding compound encircling the die, wherein the molding compound fills into gaps between the bumps; vias over and electrically connected to the bumps; and redistribution traces over and electrically connected to the bumps.

An advantageous feature of the present invention is that since stud bumps are formed on package substrates, the damage to semiconductor chips caused by the formation of stud bumps is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel package structure and methods of forming the same are provided. The intermediate stages of manufacturing a preferred embodiment of the present invention are illustrated. Throughout the various views and illustrative embodiments of the present invention, like reference numbers are used to designate like elements.

Figure 2:
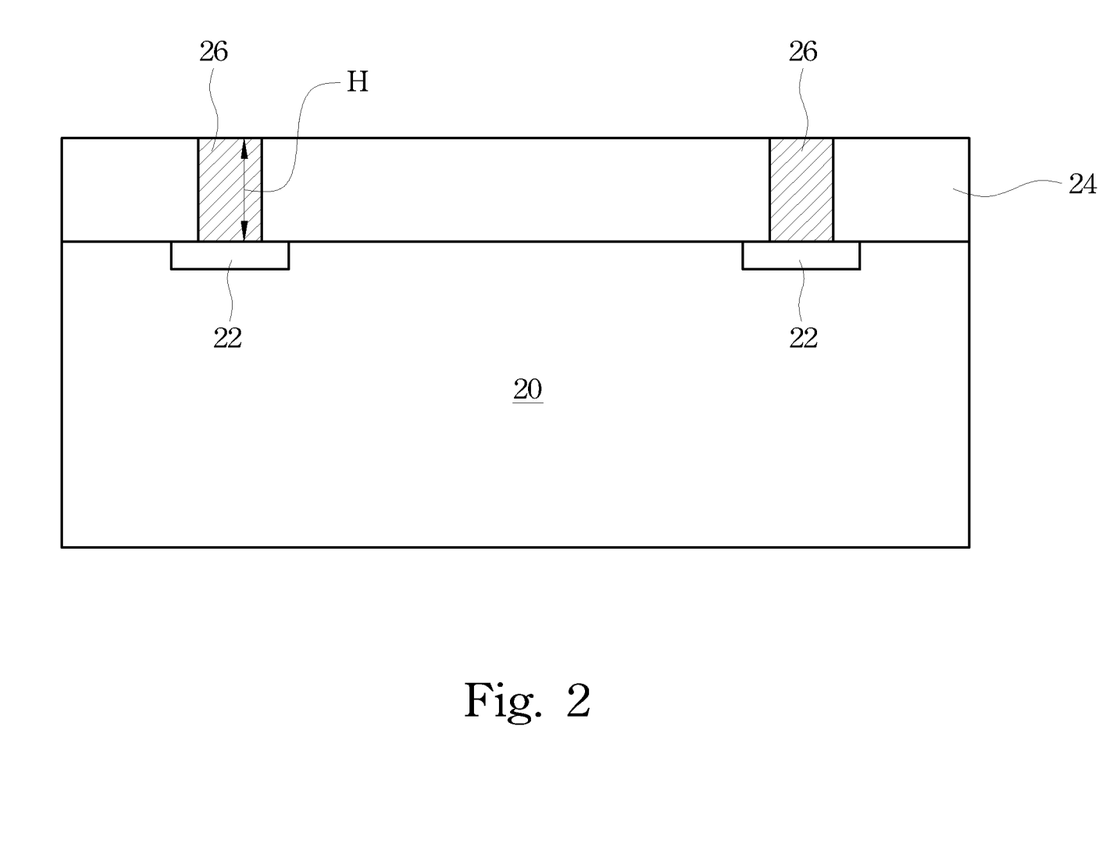
FIGS. 2 through 11 are cross-sectional views of intermediate stages in the manufacturing of an embodiment of the present invention, wherein a fan-out type package is formed.

Referring to FIG. 2, die 20 is provided. Die 20 preferably includes a semiconductor substrate having integrated circuits and overlying interconnect structures (not shown) formed therein. Bond pads 22 are formed on the top surface of die 20, and are interconnected to the integrated circuits through the interconnect structures. Bond pads 22 may be formed of aluminum, copper, nickel, and combinations thereof. Preferably, the semiconductor wafer (not shown), on which die 20 is located, is tested. Die 20 is then sawed from the semiconductor wafer. Accordingly, die 20 is a known-good-die.

FIG. 2 also illustrates the formation of bumps 26, each connected to one of the bond pads 22. Bumps 26 preferably include copper, and hence are alternatively referred to as copper bumps 26 throughout the description. Other conductive materials, such as nickel and aluminum may also be included in copper bumps 26. Copper bumps 26 preferably have top surfaces higher than a top surface of die 20, and height H of copper bumps 26 is preferably greater than about 40 µm. More preferably, height H is about 50 µm. The optimum value of height H is partially determined by the viscosity of the subsequently used molding compound for filling the space between copper bumps 26. Preferably, the greater the viscosity, the greater value height H will have. More details will be provided in subsequent paragraphs. The formation of copper bumps 26 may include forming a disposable layer 24, which may be a dielectric layer or a dry film, and forming openings in the disposable layer 24, exposing bond pads 22. Copper bumps 26 may then be formed in the openings, for example, by plating. Disposable layer 24 is then removed.

Figure 3:
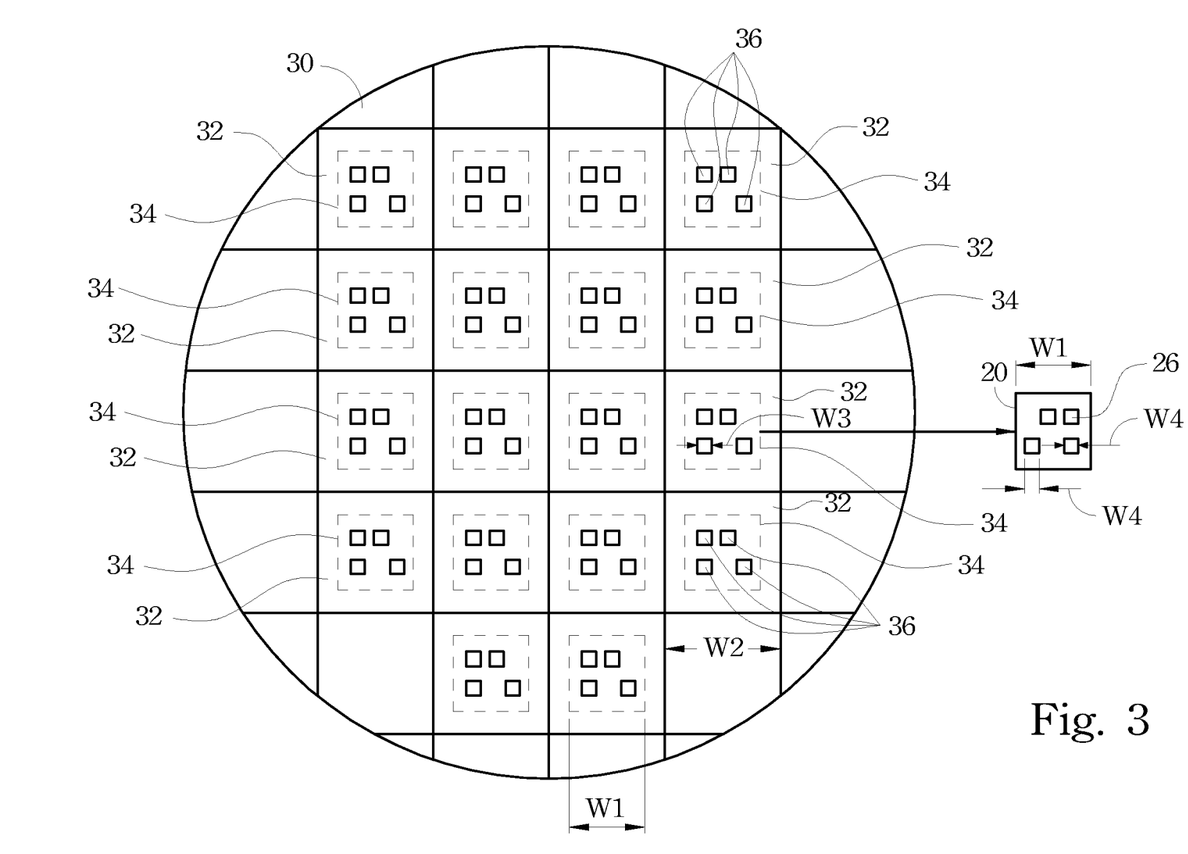

FIG. 3 illustrates a top view of chip carrier 30. In the preferred embodiment, chip carrier 30 has a shape and a size of commonly used semiconductor wafers, so that the operation on the chip carrier may be preformed easily with existing equipments. Accordingly, chip carrier 30 has a circular shape. Alternatively, chip carrier 30 may have other shapes, such as a square. The base material of chip carrier 30 may include silicon, glass, or other materials. In the preferred embodiment, the base material of chip carrier 30 is not wettable to melted solder, such that the melted solder is substantially un-attachable on the base material.

Chip carrier 30 is divided into a plurality of sub regions 32, each having a size (a width and a length) equal to the desirable size of the package to be formed. In an embodiment, a fan-out type package is the package to be formed, and hence the width W2 (or length) of sub regions 32 is greater than width W1 of die 20. In other embodiments, the package to be formed is a fan-in type package, and hence width W2 is substantially equal to width W1 of die 20. In subsequent paragraphs, a fan-out type package is formed as an example to explain the concept of the present invention. However, it is appreciated that the teaching provided by the present invention is readily applicable on fan-in type packages.

The dashed squares 34 in sub regions 32 represent the desirable positions for mounting dies, and each of the sub regions 32 preferably has a same size as die 20. Pads 36 are formed in dashed squares 34, and are surrounded by the base material. It is noted that the positions and spacing of pads 36 are mirrored from copper bumps 26 on die 20. For a clear view, die 20 is schematically illustrated in FIG. 3. When die 20 is flipped and placed in a dashed region 34, copper bumps 26 contact pads 36 in a one-to-one correspondence. Preferably, pads 36 are wettable to the melted solder, and may include materials such as copper, nickel, and the like. Pads 36 may be substantially embedded in, and exposed through, chip carrier 30. The size of pads 36 is preferably substantially equal to, or smaller than, the size of copper bumps 26. In an exemplary embodiment, pads 36 have a width W3 greater than width W4 of copper bumps 26 by between about 20 percent and about 80 percent. Each of the pads 36 may be applied with flux, followed by the placement of solder balls, each on one of the pads 36. Flux can be applied using a plurality of pins, each corresponding to one of the pads 36 (not shown in FIG. 3. Please refer to FIG. 4). Solder balls may be transferred using a ball-mounting head. In alternative embodiments, the flux and solder balls may be applied on copper bumps 26 of dies 20 (refer to FIG. 2) instead. Alternatively, Flux is applied on copper bumps 26 or pads 36 by a flux dipping process.

Figure 4:
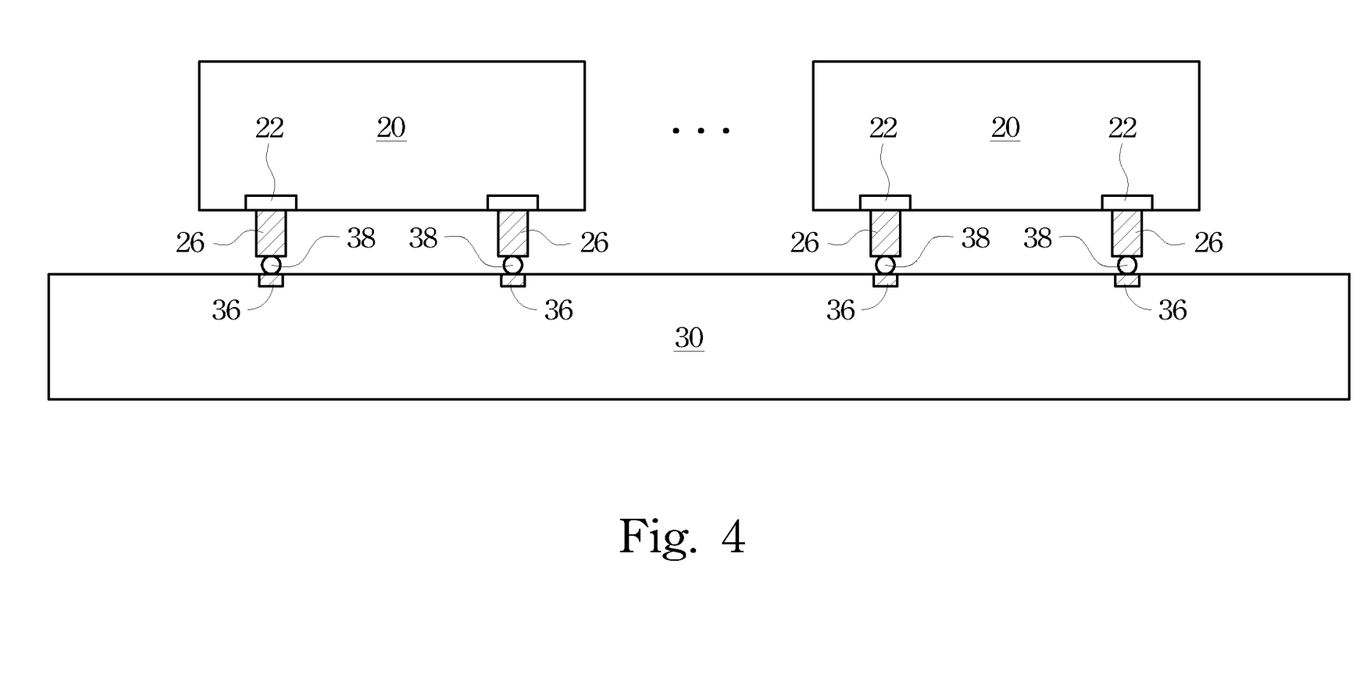

FIGS. 4 through 11 illustrate cross-sectional views in the packaging of dies 20 onto a package substrate. It is noted that although only two dies 20 are illustrated, a plurality of dies are actually packaged simultaneously, each on a sub region 32 in chip carrier 30. Referring to FIG. 4, dies 20 are placed on chip carrier 30, and copper bumps 26 are aligned to pads 36 on chip carrier 30, with solder balls 38 therebetween.

Figure 5:
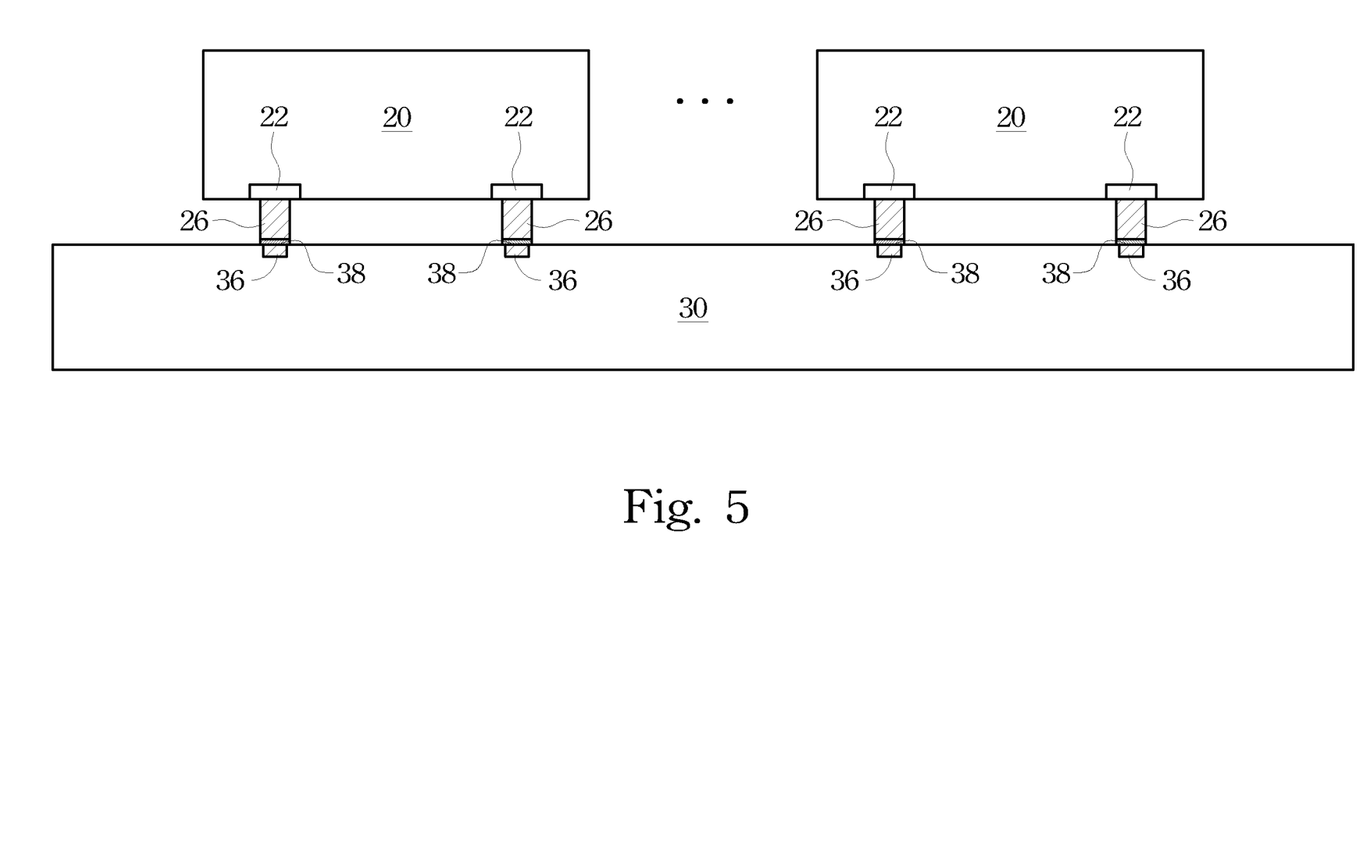

Referring to FIG. 5, after all dies 20 are placed and substantially aligned, a reflow is performed to solder dies 20 to chip carrier 30. Advantageously, during the reflow process, if copper bumps 26 are slightly offset from the corresponding pads 36, the melted solders 38 will naturally apply a force to pull dies 20 to correct positions. Accordingly, dies 20 are self-aligned to desirable positions.

Figure 6:
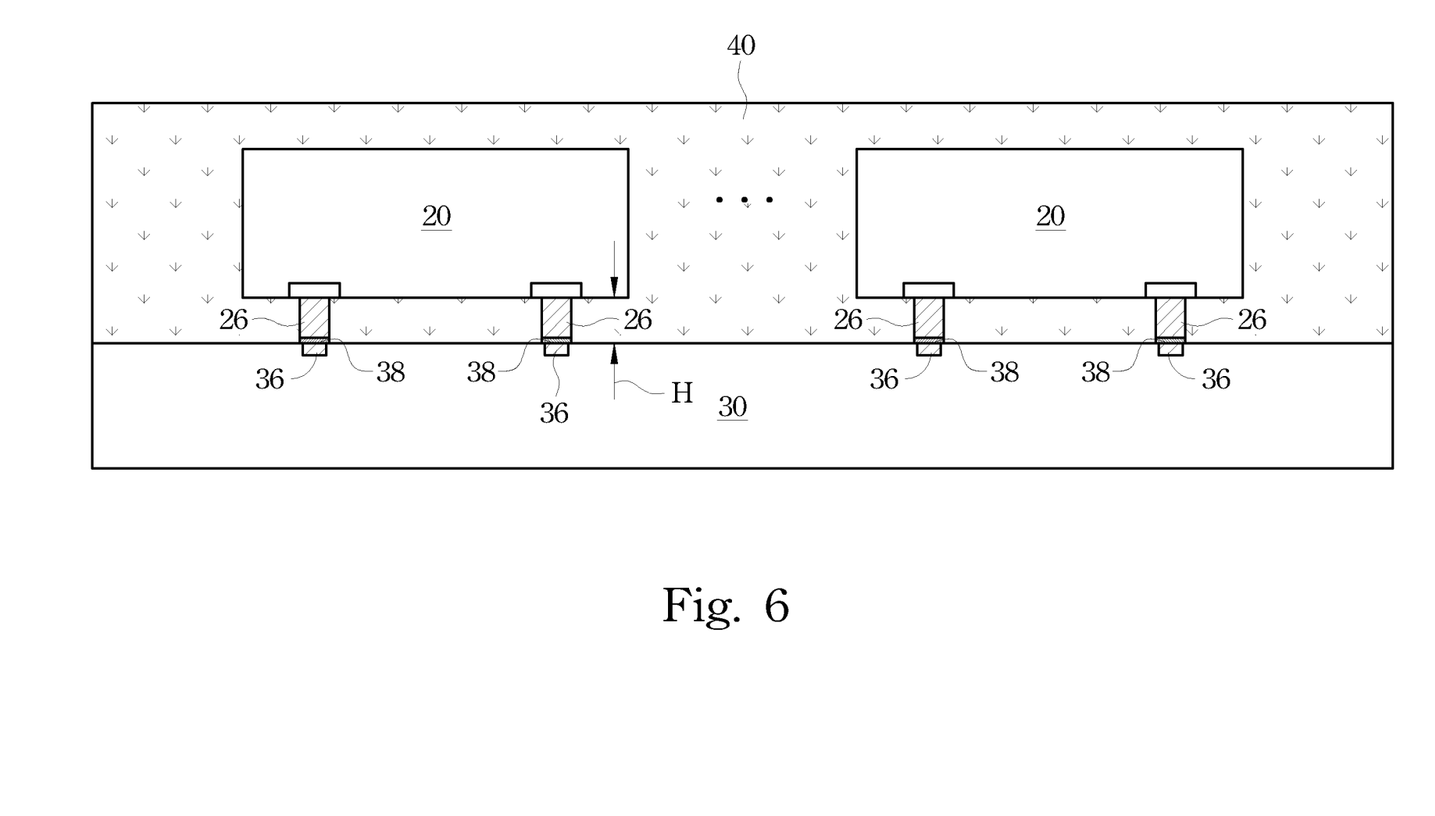

After the reflow and the cool down of solders 38, molding compound 40 is used to cover dies 20, as is illustrated in FIG. 6. Molding compound 40 may include epoxies or other commonly used materials. Preferably, molding compound 40 covers all dies 20 on chip carrier 30, and preferably flows into the gaps between copper bumps 26. To ensure good gap filling ability, the height H of copper bumps 26 is preferably greater than about 40 µm. More preferably, the height H is about 50 µm, as discussed in the preceding paragraphs. Further, the viscosity of molding compound 40 is preferably small. If molding compound 40 has a greater viscosity, the height H needs to be increased. Molding compound 40 preferably has a coefficient of thermal expansion (CTE) close to a CTE of dies 20.

Chip carrier 30 is then de-mounted from molding compound 40 and dies 20 by reflowing solders 38 again. In the resulting structure, copper bumps 26 (along with possible remaining solders 38, which are not shown in subsequent drawings) are exposed through molding compound 40. A mechanical grinding or polishing may be performed to remove solder residues on copper bumps 26. A plasma cleaning may then be performed to clean the surface of molding compound 40 and copper bumps 26.

Figure 7:
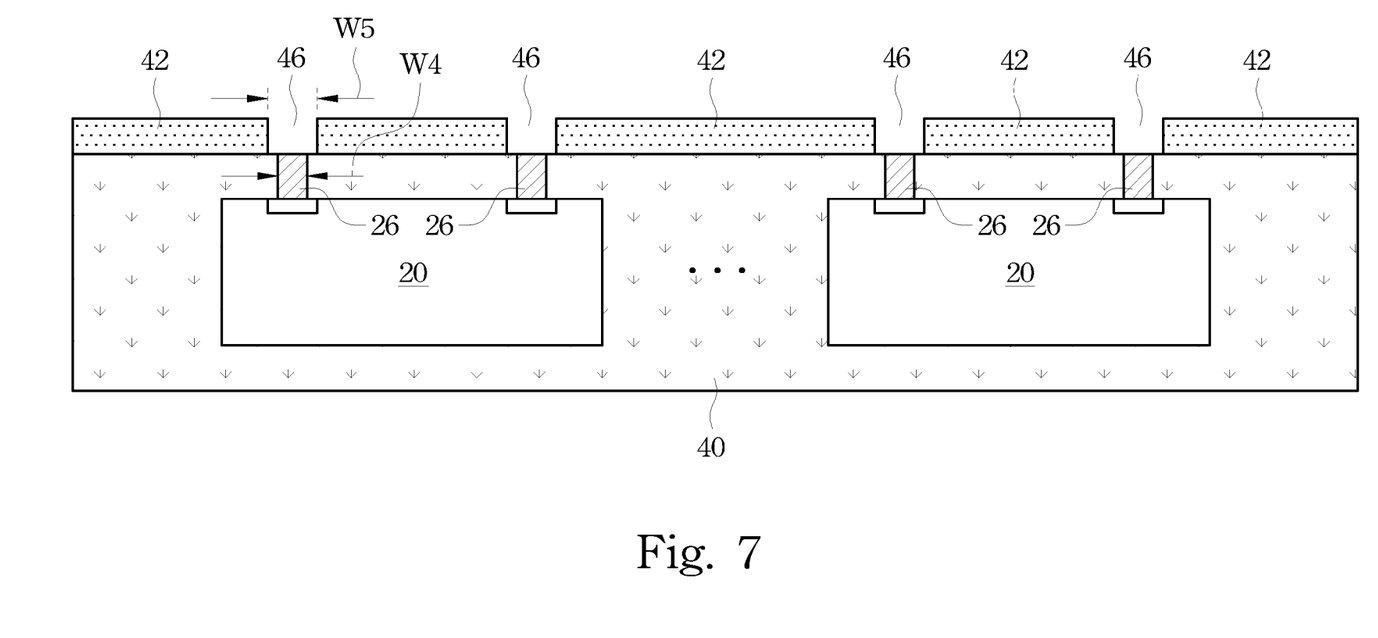

Referring to FIG. 7, the structure formed in the preceding steps is flipped upside down, and build-up layer 42 is blanket formed. In the preferred embodiment, build-up layer 42 includes an organic material such as Ajinimoto buildup film (ABF). However, other common materials such as Prepreg can be used. In the case build-up layer 42 is formed of ABF, the ABF film is laminated on molding compound 40. Heat and pressure are then applied to the laminated ABF film to soften it so that a flat top surface is formed. In the resulting structure, build-up layer 42 may have a thickness of between about 30 µm and about 50 µm.

Openings 46 are then formed in build-up layer 42 to expose copper bumps 26. In an exemplary embodiment, openings 46 are formed by laser drilling. Preferably, openings 46 have width (and a length) W5 greater than width W4 of the underlying copper bumps 26. In an exemplary embodiment, a ratio of width W5 to width W4 is greater than about 1.2. With a greater width W5, the contact between metal vias formed in openings 46 and copper bumps 26 have greater mechanical strengths.

Figure 8:
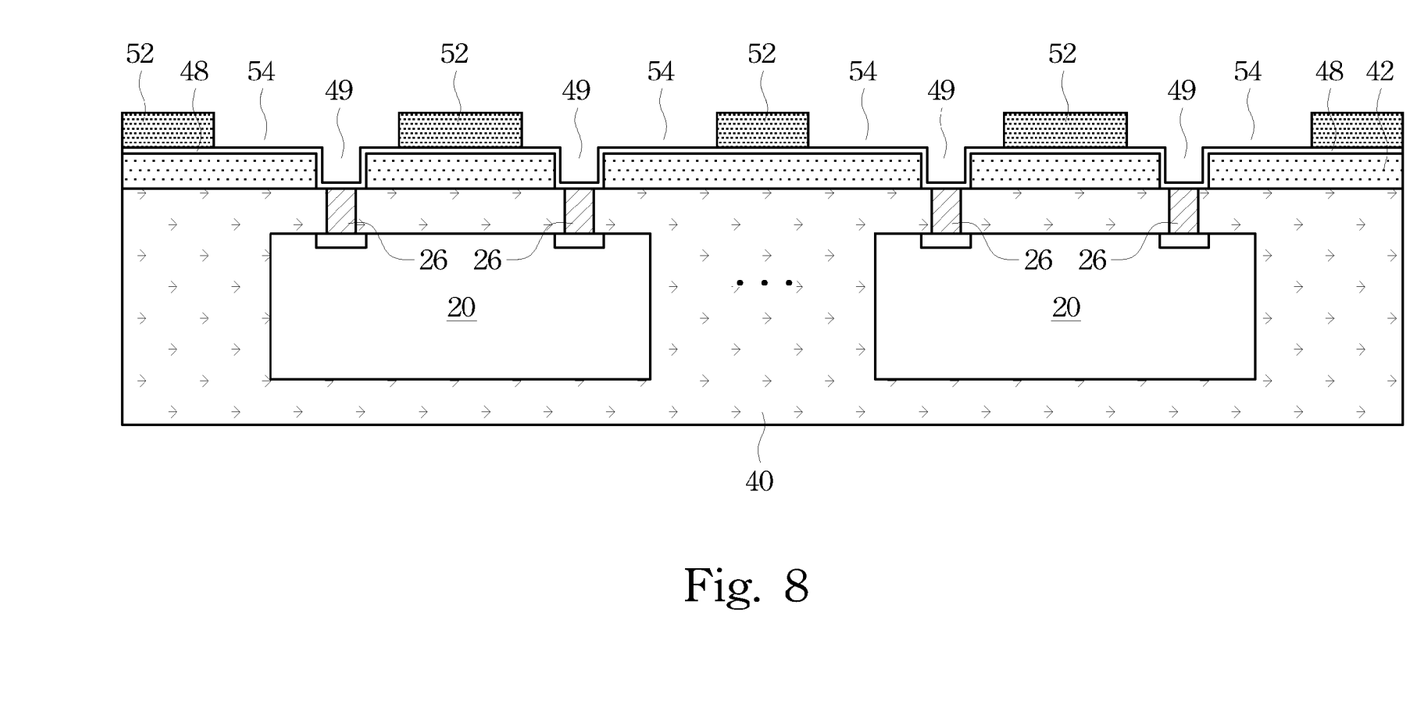

Referring to FIG. 8, thin seed layer 48, preferably including copper, is formed on the surface of build-up layer 42 and copper bumps 26, wherein the formation of seed layer 48 may include sputtering or electroless plating. Thin seed layer 48 may have a thickness of less than, for example, about 1 μm. Disposable build-up layer 52 is then formed on seed layer 48, followed by a patterning process to form openings 49, which are directly over copper bumps 26. The patterning also defines openings 54 for forming redistribution traces. The thickness of disposable build-up layer 52 is preferably determined by the desired thickness of the subsequently formed redistribution traces. In an exemplary embodiment, the thickness of disposable build-up layer 52 is between about 25 μm and about 35 μm.

Figure 9:
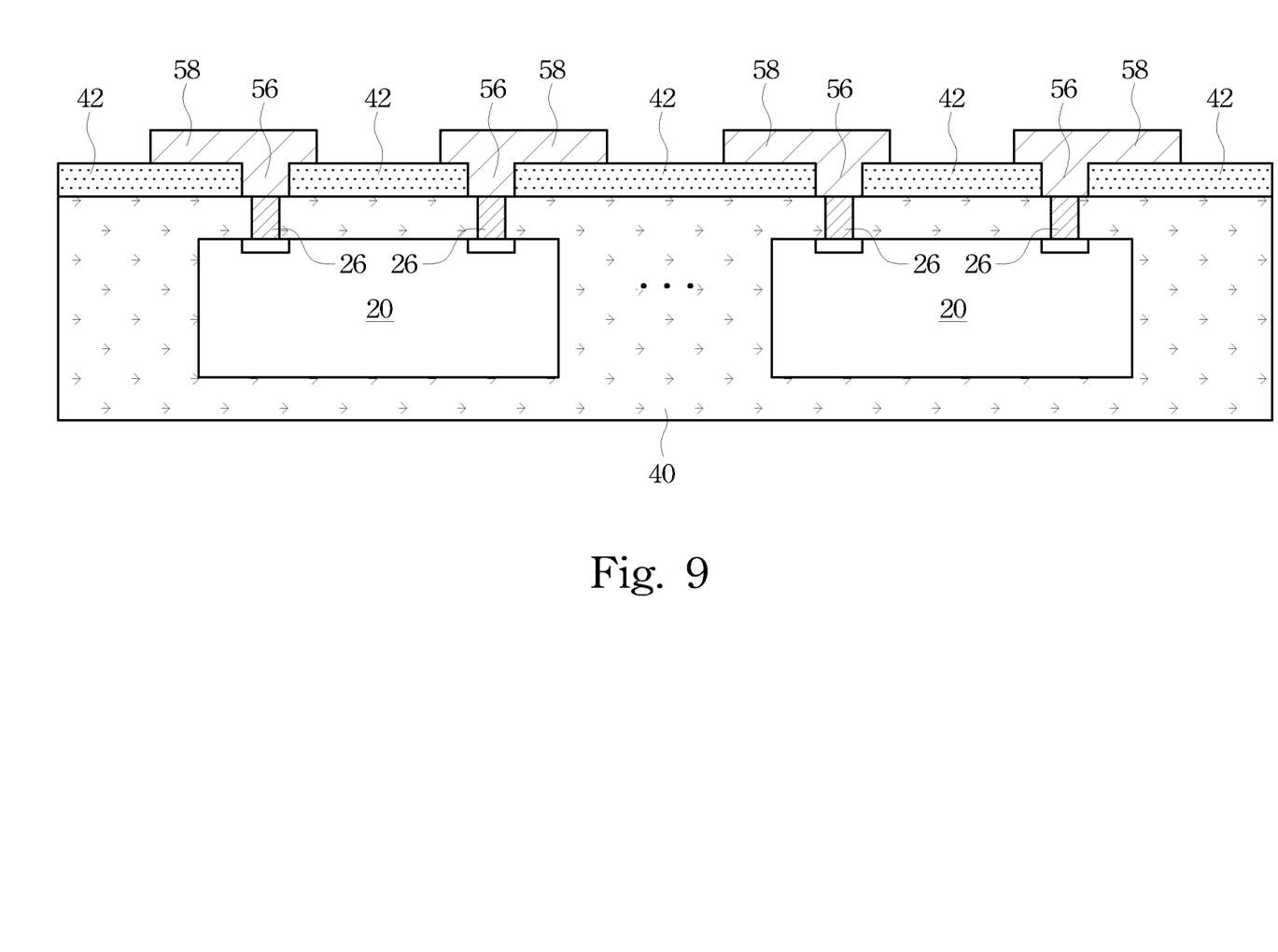

Referring to FIG. 9, conductive patterns are formed, for example, by selectively electro-plating on the portions of the seed layer 48 not covered by disposable build-up layer 52. The conductive patterns include vias 56 in openings 49, and redistribution traces 58 in openings 54. The conductive patterns are preferably formed of copper or copper alloys, although other commonly used metals such as silver and nickel can also be used. Top surfaces of redistribution traces 58 are preferably level with, although they can be slightly lower than, the top surface of disposable build-up layer 52 (refer to FIG. 8). After the formation of the conductive patterns, disposable build-up layer 52 and the portions of thin seed layer 48 underlying disposable build-up layer 52 are removed. In an exemplary embodiment, disposable build-up layer 52 is removed in an alkaline solution, and the portions of seed layer 48 under disposable build-up layer 52 are removed by a flash etching. As a side effect, a thin surface layer is also removed from redistribution traces 58 by the flash etching. However, the removed surface layer has a thickness significantly less than the overall thickness of redistribution traces 58, and thus will not affect their electrical performance. Since seed layer 48 is typically formed of a substantially same material as the conductive patterns, the remaining seed layer 48 is subsequently undistinguishable from the overlying redistribution traces 58 and vias 56, and hence is not shown.

Figure 10:
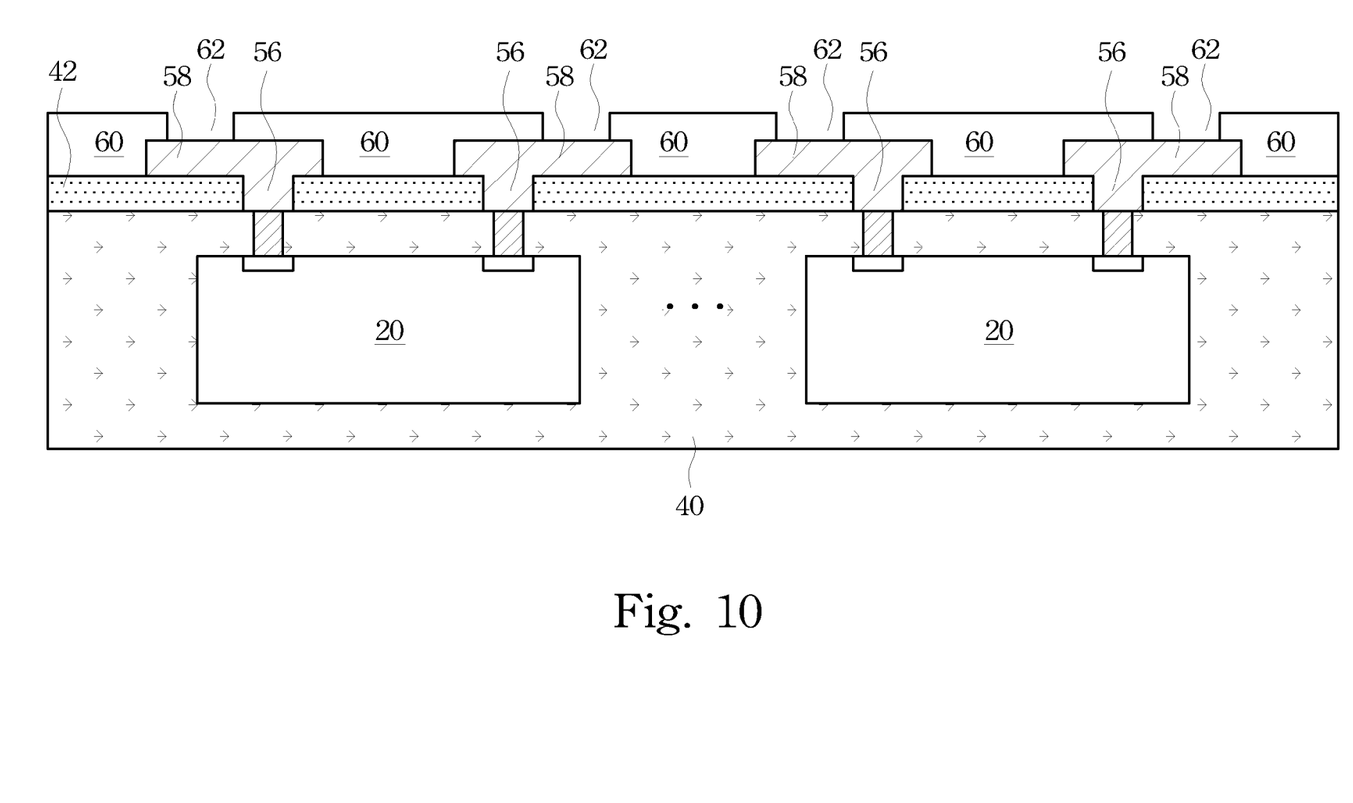

FIG. 10 illustrates the formation of solder resist coating (also referred to as solder mask) 60. Solder resist coating 60 may have a thickness of about 20 μm. Solder resist openings (SRO) 62 are then formed in solder resist coating 60, exposing underlying redistribution traces 58, which also act as bump pads. If necessary, more redistribution layers, each including vias and overlying redistribution traces, may be formed overlying, and connected to, redistribution traces 58. The formation of the additional redistribution layer is essentially the same as forming vias 56 and redistribution traces 58. Further, instead of using redistribution traces 58 as bump pads, additional bump pads may be formed and connected to the underlying redistribution traces 58.

Figure 11:
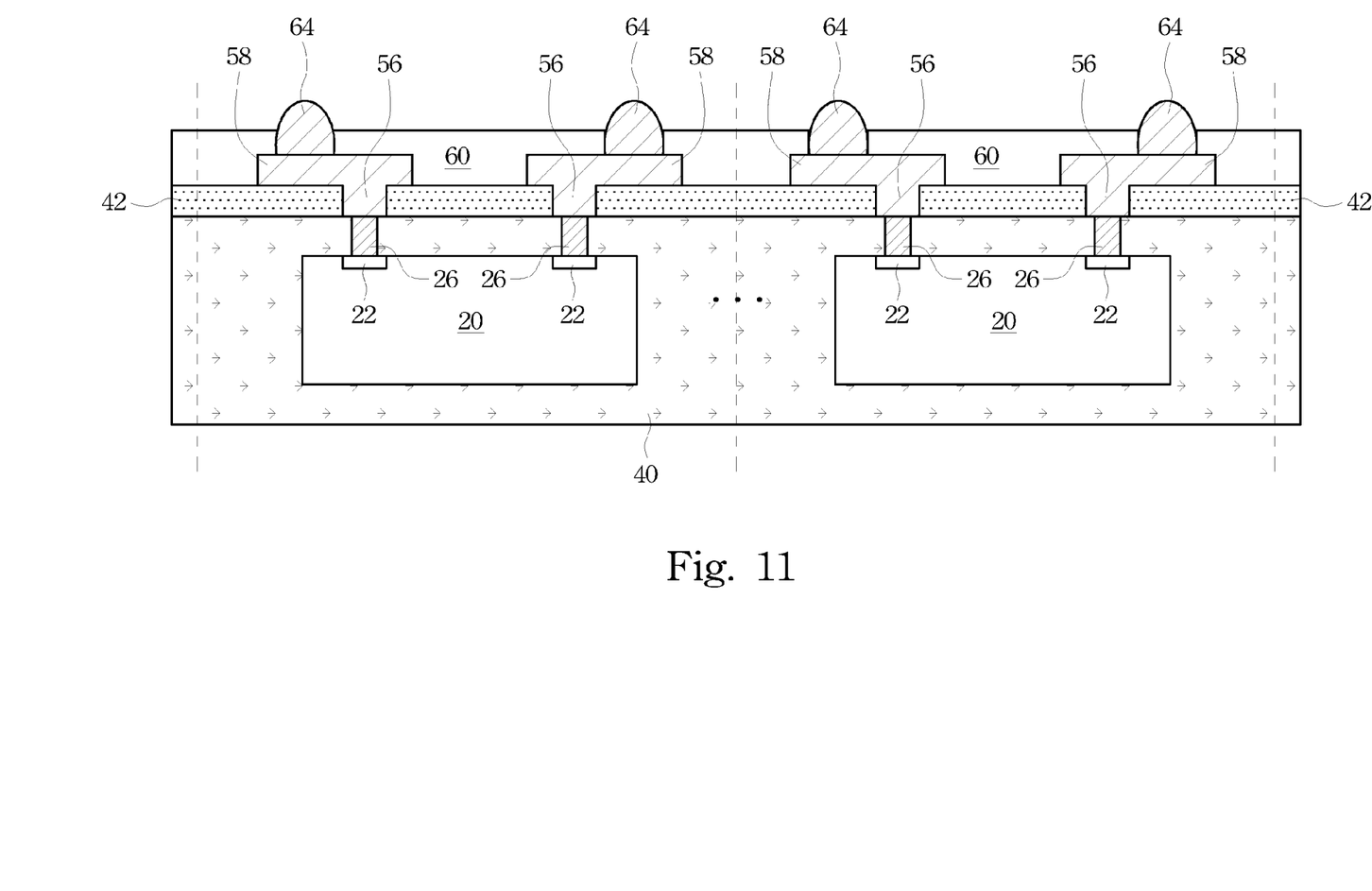

Referring to FIG. 11, ball grid array (BGA) balls 64 are mounted on exposed redistribution traces 58. The details for forming solder mask 60 and BGA balls 64 are well known in the art, thus are not repeated herein. BGA balls 64 may be located directly over the respective die 20, hence the respective package is a fan-in package. Alternatively, BGA balls 64 may be located horizontally beyond edges of the respective dies 20, hence the respective package is a fan-out package. Dies 20 and its enclosing molding compound 40 may then be sawed along the dashed lines to form individual packages, each including a die and the overlying redistribution traces and BGA balls.

The package formed by the process discussed in the preceding paragraphs has several advantageous features. Firstly, the mounting of the dies onto the chip carrier is self-aligned. Accordingly, in subsequent laser drilling and redistribution trace formation, the likelihood that vias and redistribution traces are misaligned from copper bumps is reduced. Secondly, the copper bumps provide a clearance for the gap-filling of molding compound, and hence the gap filling is improved. Thirdly, vias 56 (refer to FIG. 11) have a greater width than copper bumps 26, providing a robust copper interconnection.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a package structure, the method comprising:
   providing a die comprising bond pads on a top surface of the die;
   forming bumps on the bond pads of the die, wherein the bumps have top surfaces higher than the top surface of the die;
   mounting the die on a chip carrier, wherein the bumps are attached to the chip carrier, and wherein the chip carrier comprises:
      pads wettable to melted solder; and
      a base material surrounding the pads, wherein the base material is not wettable to the melted solder;
   molding the die onto the chip carrier with a molding compound;
   de-mounting the chip carrier from the die; and
   forming redistribution traces over, and electrically connected to, the bumps of the die.

2. The method of claim 1, wherein during the step of mounting the die on the chip carrier, each of the bumps on the die is attached to one of the pads on the chip carrier.

3. The method of claim 1, wherein sizes of the pads on the chip carrier are substantially equal to, or greater than, the bumps on the die.

4. The method of claim 1, wherein the step of forming the redistribution traces comprises:
   forming a dielectric layer on the molding compound;
   forming openings in the dielectric layer to expose the bumps;
   filling the openings to form vias; and
   forming metal traces electrically connected to the vias.

5. The method of claim 4, wherein the openings have a width greater than a width of the bumps.

6. The method of claim 1 further comprising mounting ball grid array (BGA) balls over, and electrically interconnected to, the redistribution traces.

7. The method of claim 6, wherein at least portions of the BGA balls are outside a region directly over the die.

8. The method of claim 1, wherein the bumps comprise copper.

9. The method of claim 1, wherein the pads are substantially embedded in the chip carrier.

10. A method of forming a package structure, the method comprising:
   providing a plurality of dies, each comprising copper bumps having top surfaces higher than top surfaces of the respective dies;
   providing a chip carrier comprising a plurality of regions, each of the plurality of regions including a plurality of pads laid out as a mirror of the copper bumps on one of the plurality of dies, wherein the plurality of pads is wettable to melted solder, and wherein a base material of the chip carrier around the plurality of pads is not wettable to the melted solder;
   placing the plurality of dies on the chip carrier, each in one of the plurality of the regions of the chip carrier, wherein the copper bumps are aligned to the pads with solder balls therebetween;
   reflowing the solder balls so that the plurality of dies is attached to the chip carrier;
   molding the plurality of dies onto the chip carrier using a molding compound to form a plurality of packages, each comprising one of the dies, wherein the molding compound fills gaps between the copper bumps and gaps between the plurality of dies;
   de-mounting the chip carrier from the plurality of dies and the molding compound;
   forming redistribution traces over, and electrically connected to, the copper bumps; and
   sawing the plurality of packages.

11. The method of claim 10, wherein the step of providing the plurality of dies comprises forming copper bumps on bond pads of the plurality of dies.

12. The method of claim 10, wherein each of the regions of the chip carrier has an area greater than an area of the plurality of dies.

13. The method of claim 10, wherein the plurality of pads on the chip carrier each has an area greater than an area of a respective one of the copper bumps.

14. The method of claim 10, wherein the plurality of pads on the chip carrier has areas equal to areas of the respective connecting copper bumps.

15. The method of claim 10, wherein the step of forming the redistribution traces comprises:
   forming a dielectric layer;
   forming openings in the dielectric layer to expose the copper bumps;
   filling the openings to form vias; and
   forming metal traces electrically connected to the vias.

16. The method of claim 15 further comprising mounting ball grid array (BGA) balls over, and electrically connected to the redistribution traces, wherein the openings have sizes greater than sizes of the copper bumps.

17. The method of claim 10, wherein at least portions of the BGA balls are outside a region directly over the plurality of dies.

18. The method of claim 10, wherein the plurality of pads is substantially embedded in the chip carrier.

* * * * *